(12) United States Patent
Abbatiello et al.

(10) Patent No.: US 10,500,814 B2
(45) Date of Patent: Dec. 10, 2019

(54) THERMOPLASTIC COMPOSITE MATERIALS FOR PORTABLE INFORMATION HANDLING SYSTEM ENCLOSURES

(71) Applicant: Dell Products L.P., Round Rock, TX (US)

(72) Inventors: Nicholas D. Abbatiello, Round Rock, TX (US); Deeder M. Aurongzeb, Austin, TX (US); Ernesto Ramirez, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 430 days.

(21) Appl. No.: 14/563,776

(22) Filed: Dec. 8, 2014

(65) Prior Publication Data
US 2016/0159046 A1   Jun. 9, 2016

(51) Int. Cl.
  *B32B 27/06*   (2006.01)
  *B32B 27/28*   (2006.01)
  (Continued)

(52) U.S. Cl.
  CPC .............. *B32B 5/12* (2013.01); *B29C 43/146* (2013.01); *B29C 70/46* (2013.01); *B29C 70/545* (2013.01); *B29D 99/0014* (2013.01); *B32B 3/266* (2013.01); *B32B 5/024* (2013.01); *B32B 5/18* (2013.01); *B32B 5/22* (2013.01); *B32B 5/245* (2013.01); *B32B 5/32* (2013.01); *B32B 27/065* (2013.01); *B32B 27/08* (2013.01); *B32B 27/12* (2013.01); *B32B 27/18* (2013.01); *B32B 27/365* (2013.01); *B29K 2269/00* (2013.01); *B29K 2281/06* (2013.01); *B29K 2307/04* (2013.01); *B29K 2309/08* (2013.01); *B29K 2313/00* (2013.01); *B29L 2031/712* (2013.01);
  (Continued)

(58) Field of Classification Search
  CPC .......... H05K 5/0091; H05K 5/03; B32B 3/12; B32B 27/08
  See application file for complete search history.

(56) References Cited

U.S. PATENT DOCUMENTS

| | | | |
|---|---|---|---|
| 6,673,415 B1 * | 1/2004 | Yamazaki | B32B 3/12 428/117 |
| 2004/0112907 A1 * | 6/2004 | Donnelly | B29C 65/18 220/660 |

(Continued)

FOREIGN PATENT DOCUMENTS

JP   05200924 A  *  8/1993

OTHER PUBLICATIONS

English language translation of JP 05-200924 A, generated on Oct. 15, 2018 with the AIPN Japan Patent Office website (https://dossier1.j-platpat.inpit.go.jp/tri/all/odse/ODSE_GM101_Top.action).*

*Primary Examiner* — Mark Ruthkosky
*Assistant Examiner* — Julia L Rummel
(74) *Attorney, Agent, or Firm* — Baker Botts L.L.P.

(57) ABSTRACT

Enclosure parts for portable information handling systems may be made by heat pressing material layers together. The material layers may include outer fiber-reinforced thermoplastic layers and a core thermoplastic layer comprising a plurality of thermoplastic film layers. The core thermoplastic layer may be die cut to create voids that reduce weight of the enclosure part. A finishing layer may be added, along with attachment features.

6 Claims, 5 Drawing Sheets

(51) Int. Cl.
  *B32B 5/12*    (2006.01)
  *B29C 43/14*   (2006.01)
  *B32B 27/36*   (2006.01)
  *B32B 5/02*    (2006.01)
  *B32B 5/18*    (2006.01)
  *B32B 5/22*    (2006.01)
  *B32B 5/24*    (2006.01)
  *B32B 5/32*    (2006.01)
  *B32B 27/08*   (2006.01)
  *B32B 27/12*   (2006.01)
  *B32B 27/18*   (2006.01)
  *B32B 3/26*    (2006.01)
  *B29C 70/46*   (2006.01)
  *B29C 70/54*   (2006.01)
  *B29D 99/00*   (2010.01)
  *B29K 269/00*  (2006.01)
  *B29K 281/00*  (2006.01)
  *B29K 309/08*  (2006.01)
  *B29K 307/04*  (2006.01)
  *B29L 31/00*   (2006.01)
  *H05K 5/00*    (2006.01)
  *H05K 5/03*    (2006.01)
  *B32B 38/10*   (2006.01)

(52) U.S. Cl.
  CPC ............. *B32B 27/286* (2013.01); *B32B 38/10* (2013.01); *B32B 2260/021* (2013.01); *B32B 2260/046* (2013.01); *B32B 2262/101* (2013.01); *B32B 2262/106* (2013.01); *B32B 2305/026* (2013.01); *B32B 2305/08* (2013.01); *B32B 2307/58* (2013.01); *B32B 2307/718* (2013.01); *B32B 2307/72* (2013.01); *B32B 2398/20* (2013.01); *B32B 2429/00* (2013.01); *B32B 2457/00* (2013.01); *H05K 5/0091* (2013.01); *H05K 5/03* (2013.01)

(56) References Cited

U.S. PATENT DOCUMENTS

2007/0256379 A1* 11/2007 Edwards ................... B32B 5/18
                                                    52/309.9
2009/0117366 A1*  5/2009 Honma ................ B29C 70/086
                                                    428/314.8
2011/0008566 A1*  1/2011 Okano ............. B29C 45/14311
                                                    428/58

* cited by examiner

THERMOPLASTIC COMPOSITE ENCLOSURE MATERIAL CORE LAYER

THERMOPLASTIC COMPOSITE MATERIALS FOR PORTABLE INFORMATION HANDLING SYSTEM ENCLOSURES

BACKGROUND

Field of the Disclosure

This disclosure relates generally to information handling systems and, more particularly, to thermoplastic composite materials for portable information handling system enclosures.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Advancements in packaging design have reduced both the weight and thickness of information handling systems. In particular, enclosure components included portable information handling systems, such as laptops, notebooks, and tablet form factors, are the object of efforts to reduce weight and thickness without compromising structural strength and, in particular, stiffness.

Conventional low-cost materials used for information handling system enclosures, such as for an outer shell for a portable information handling system, have typically included fiber-filled injection molded material, which becomes problematic as overall thickness of the enclosure parts becomes smaller. For example, as manufacturing yield rates fall with decreasing thickness, fiber-filled injection molded material may actually increase in cost, while providing strength and stiffness that is less than desired. Other materials, such as magnesium, may suffer from similar manufacturing yield rate issues at currently desired small thicknesses.

Other materials used for portable information handling system enclosures include composites made from woven carbon fiber, which provide high strength and stiffness, but have much higher costs. Thus, the use of woven carbon fiber composite materials for information handling system enclosures may be economically limited to particular applications where the higher cost is acceptable.

Accordingly, it is desirable to have cost-effective materials and corresponding manufacturing methods for information handling system enclosures that yield lightweight, thin yet sufficiently robust enclosure parts.

SUMMARY

In one aspect, a disclosed method is for manufacturing enclosure parts for portable information handling systems. The method may include heat pressing material layers to form an enclosure part for a portable information handling system. The material layers may include a first fiber-reinforced thermoplastic outer layer, a core thermoplastic layer comprising a plurality of thermoplastic film layers, and a second fiber-reinforced thermoplastic outer layer.

In certain embodiments, prior to the heat pressing, the method may include die cutting the core thermoplastic layer to remove thermoplastic material and reduce a density of the core thermoplastic layer. The die cutting may hexagonally pattern the core thermoplastic layer.

Other disclosed aspects include an enclosure part for portable information handling systems, and a portable information handling system including the enclosure part.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

Figure 1:
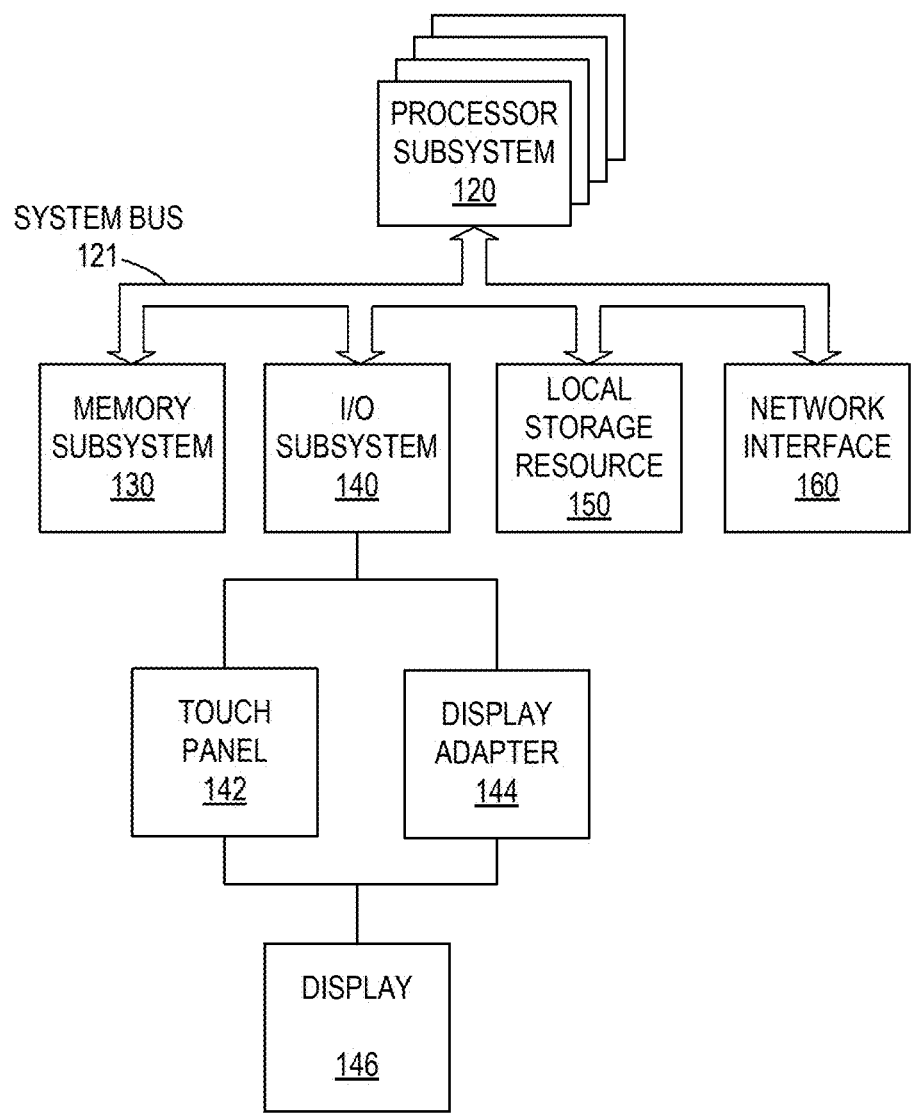
FIG. 1 is a block diagram of selected elements of an embodiment of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

As noted previously, current portable information handling systems may demand ever thinner and lighter products, without sacrificing strength and stability. As portable information handling systems become widespread, lighter and thinner enclosure parts for portable information handling systems are increasingly desirable without sacrificing strength and stiffness of the enclosure parts. In particular, lower cost alternatives to composite enclosure parts formed using woven carbon fiber are desired. As will be described in further detail, the inventors of the present disclosure have developed methods and structures disclosed herein for manufacturing enclosure parts for portable information handling systems. The disclosed enclosure parts may be thin and lightweight, while meeting expectations for strength and stiffness at a lower cost than woven carbon fiber composite enclosure parts.

Particular embodiments are best understood by reference to FIGS. 1, 2, 3A, 3B, 4A, 4B, 4C, 4D, 5, and 6 wherein like numbers are used to indicate like and corresponding parts.

Turning now to the drawings, FIG. 1 illustrates a block diagram depicting selected elements of an embodiment of information handling system 100. As shown in FIG. 1, components of information handling system 100 may include, but are not limited to, processor subsystem 120, which may comprise one or more processors, and system bus 121 that communicatively couples various system components to processor subsystem 120 including, for example, a memory subsystem 130, an I/O subsystem 140, local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

In FIG. 1, network interface 160 may be a suitable system, apparatus, or device operable to serve as an interface between information handling system 100 and a network 155. Network interface 160 may enable information handling system 100 to communicate over network 155 using a suitable transmission protocol and/or standard, including, but not limited to, transmission protocols and/or standards enumerated below with respect to the discussion of network 155. In some embodiments, network interface 160 may be communicatively coupled via network 155 to network storage resource 170. Network 155 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network 155 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 155 and its various components may be implemented using hardware, software, or any combination thereof.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of physical hardware 102). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down. Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, network storage resource 170 may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data. In system 100, I/O subsystem 140 may comprise a system, device, or apparatus generally operable to receive and/or transmit data to/from/within system 100. I/O subsystem 140 may represent, for example, a variety of communication interfaces, graphics interfaces, video interfaces, user input interfaces, and/or peripheral interfaces. As shown, I/O subsystem 140 may comprise touch panel 142 and display adapter 144. Touch panel 142 may include circuitry for enabling touch functionality in conjunction with display 146 that is driven by display adapter 144.

In particular embodiments, information handling system 100 may be a portable information handling system, such as in the form of laptop, notebook, netbook, and tablet computers, among others, or personal mobile devices, such as smart phones. Typically, portable information handling systems are designed for hand-held operation and are enclosed. As will be described in further detail, information handling system 100 may accordingly include enclosure parts made using thermoplastic composite materials.

Traditional composite materials are typically are made from different layered configurations comprised of multiple repeating fiber-reinforced layers throughout the structure. As noted, woven carbon fiber is known for fiber reinforced composite materials but is relatively expensive. When the fiber-reinforced layers are used throughout the material structure, cost and weight may be increased while stiffness may not be substantially improved of the composite multi-layered structure. In contrast, the thermoplastic composite materials used for enclosure parts, as described herein, may reduce cost while improving structural performance, in terms of both strength and stiffness, by using fiber-reinforced layers for the outer layers of the material structure. To the extent that the fiber-reinforced layers increase weight, the limited used of fiber-reinforced layers in the thermoplastic materials described herein may further reduce weight, which is desirable. In addition to the fiber-reinforced outer layers, the thermoplastic materials described herein may use a relatively light non-reinforced thermoplastic material as a core layer to reduce weight. Additionally, the same or similar thermoplastic matrix material may be used in the fiber-reinforced outer layers and the core layers, such as thermoplastic compositions comprising polycarbonate or polysulfonate. As a result, adhesives and bonding agents may be substantially eliminated from the manufacturing process, which further increases simplicity and cost-effectiveness of the manufacturing process.

Figure 2:
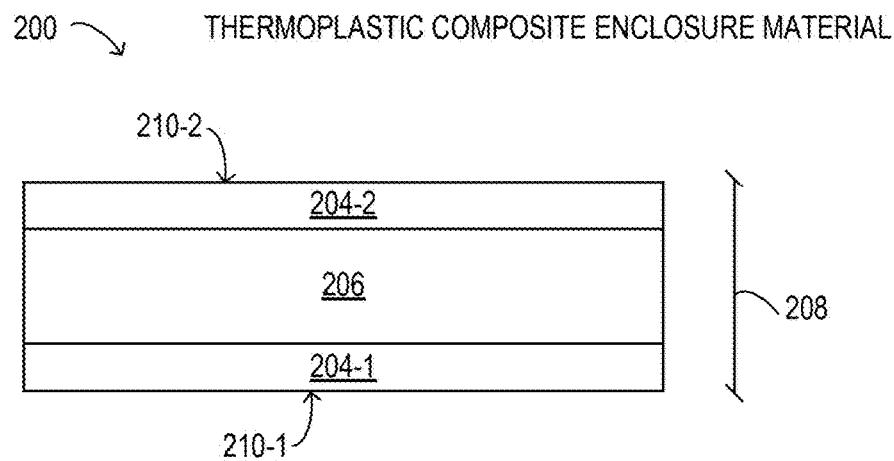
FIG. 2 is a block diagram of selected elements of an embodiment of a thermoplastic enclosure material.

Referring now to FIG. 2, selected elements of an embodiment of thermoplastic composite enclosure material 200 are illustrated. As shown, thermoplastic composite enclosure material 200 may represent various embodiments of materials used for enclosure parts for portable information handling systems described herein and is shown in cross-section for descriptive clarity. Thermoplastic composite enclosure material 200 includes outer layers 204 and core layer 206. Outer layers 204 and core layer 206 of thermoplastic composite enclosure material 200 may be cut to a size desirable for an enclosure part. In particular embodiments, outer layers 204 and core layer 206 are shaped in a rectangular or near-rectangular form that is suitable for compact portable information handling systems. In given embodiments, outer layers 204 and core layer 206 may be formed using thermoplastic compositions comprising polycarbonate or polysulfonate. It is noted that various combinations of different embodiments of thermoplastic composite enclosure material 200 described herein may be implemented, as desired for a particular application.

In FIG. 2, core layer 206 may be comprised of a thermoplastic material that is not fiber-reinforced. Core layer 206 may be constructed or assembled using thermoplastic film layers of the thermoplastic material that are each relatively thin and are stacked together to achieve a desired thickness for core layer 206. Because fiber-reinforcement of outer layers 204 may be used in thermoplastic composite enclosure material 200 to achieve desired strength and stiffness, core layer 206 may structurally serve as a spacer layer for supporting outer layers 204. Accordingly, certain modifications may be made to core layer 206 in different embodiments to reduce a density of core layer 206 and thereby reduce weight of core layer 206.

In particular embodiments, core layer 206 may be formed with voids to remove a certain amount of material of core layer 206 without altering an overall dimension of core layer 206. The voids may be irregularly shaped or spaced apart from each other. In certain cases, the voids may be regularly shaped and formed in a pattern. In the exemplary embodiment presented in further detail below with respect to FIGS. 4A-D, the voids may be formed in a hexagonal pattern. The voids may be die cut in core layer 206 prior to assembly and heat pressing of outer layers 204 and core layer 206 to form the enclosure part. In certain embodiments, the voids are die cut using a single operation on a plurality of thermoplastic film layers used to form core layer 206.

In given embodiments, core layer 206 may be formed with a thermoplastic material that has been subject to a foaming agent to reduce density by generating a foam structure. The foaming agent may be applied to the thermoplastic film layers during manufacture thereof prior to forming thermoplastic composite enclosure material 200.

As shown in FIG. 2, outer layer 204-1 may represent a first fiber-reinforced outer layer having first surface 210-1, while outer layer 204-2 may represent a second fiber-reinforced outer layer having second surface 210-2. Throughout this disclosure for clarity, first surface 210-1 represents an external surface of the enclosure part, while second surface 210-2 represents an internal surface of the enclosure part that is attached to the portable information handling system. In given embodiments, outer layers 204-1 and 204-2 may be comprised of the same material. In various embodiments, different materials may be used to form outer layer 204.

In one embodiment, a woven fiberglass mat impregnated with a thermoplastic matrix material, such as polycarbonate, is used to form outer layer 204 as a woven-fiberglass-reinforced thermoplastic material.

In another embodiment, outer layer 204 may be formed using a first thermoplastic tape layer comprising unidirectional carbon fibers having a first orientation of the unidirectional carbon fibers and a second thermoplastic tape layer comprising unidirectional carbon fibers having a second orientation of the unidirectional carbon fibers. The second orientation may be different from the first orientation. For example, the first orientation may be 90° with respect to the second orientation. The unidirectional carbon fibers may be long continuous parallel strands of carbon fiber that are not woven together. The thermoplastic tape layers of unidirectional carbon fibers may be less costly than a woven-carbon fiber-reinforced thermoplastic material, but may still provide certain advantages of carbon fiber, in particular embodiments.

Depending on the particular embodiment and implementation, thickness 208 of thermoplastic composite enclosure material 200 may be between about 0.6 mm and 1.4 mm, which may additionally include a finishing layer and attachment features, as described below with respect to FIGS. 3A and 3B. In particular embodiments, outer layers 204 may be formed to a final thickness of about 0.25 mm in the enclosure part, with core layer 206 dimensioned for the remaining desired thickness. In various embodiments, thermoplastic composite enclosure material 200 may have a diagonal size of about 7 inches or greater, up to a diagonal size of about 17 inches. It is noted that, due to the specialized nature of enclosure covers for portable information handling systems, overall desired dimensions of the enclosure part may be specified using a dimensionless ratio of the diagonal size (for a substantially rectangular-shaped enclosure part) to the thickness of the enclosure part. Accordingly, the ratio of a maximum diagonal dimension to a minimum thickness of the enclosure part may be between about 170 to about 400.

Figure 3A:
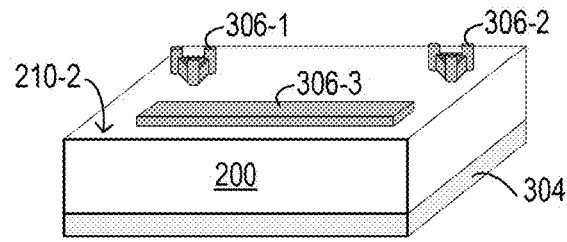
FIG. 3A is a block diagram of selected elements of an embodiment of a thermoplastic enclosure material.

Referring now to FIG. 3A, selected elements of an embodiment of thermoplastic composite enclosure material 300 are illustrated. As shown, thermoplastic composite enclosure material 300 may represent various embodiments of materials used for enclosure parts for portable information handling systems described herein and is shown in a 3-dimensional view. Thermoplastic composite enclosure material 300 includes thermoplastic composite enclosure material 200 (see FIG. 2), as well as finishing layer 304 and attachment features 306.

In FIG. 3A, finishing layer 304 is shown covering first surface 210-1, which has been obscured. In some embodiments, finishing layer 304 may be added to thermoplastic composite enclosure material 200 to form a decorative or protective layer that is a final external surface of the enclosure part. In this manner, inclusion of finishing layer 304 may reduce manufacturing operations and cost involved with manufacturing the enclosure part. At least certain portions of finishing layer 304 may include a colorant to achieve a desired color of the enclosure part. Finishing layer 304 may include an integrated protective layer that is cured using ultraviolet light after the enclosure part is formed. In some embodiments, finishing layer 304 includes a film carrier that is removably attached with an adhesive for removal after the enclosure part is formed, in order to expose a final desired external surface of the enclosure part.

Also in FIG. 3A, attachment features 306 are shown attached at second surface 210-2. Attachment features 306-1 and 306-2 may represent boss clusters to provide attachment points for the enclosure part to the portable information handling system. Also shown is attachment feature 306-3, which may be a piece of thermoplastic material used to form additional features, such as bosses, tabs, hinge frames, snap-in connectors, etc. used to attach the enclosure part to the portable information handling system. As shown in FIG. 3A, attachment features 306 are bonded directly to thermoplastic composite enclosure material 200 at second surface 210-2. Because second surface 210-2 and attachment features 306 may be made of the same thermoplastic material, attachment features 306 may be bonded without the use of adhesives or bonding agents, and may be bonded using ultrasonic welding or solvent bonding, for example. When thermoplastic composite enclosure material 300 is heat pressed to form the enclosure part, attachment features 306 may be molded to a final form (not shown), as desired.

Figure 3B:
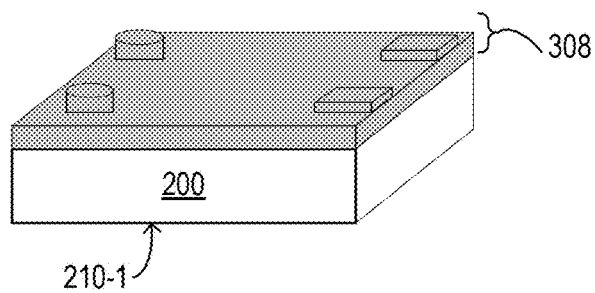
FIG. 3B is a block diagram of selected elements of an embodiment of a thermoplastic enclosure material.

Referring now to FIG. 3B, selected elements of an embodiment of thermoplastic composite enclosure material 301 are illustrated. As shown, thermoplastic composite enclosure material 301 may represent various embodiments of materials used for enclosure parts for portable information handling systems described herein and is shown in a 3-dimensional view. Thermoplastic composite enclosure material 301 includes thermoplastic composite enclosure material 200 (see FIG. 2), as well as attachment layer 308. It is noted that thermoplastic composite enclosure material 301 may further include finishing layer 304 at first surface 210-1, as described above with respect to FIG. 3A, in various embodiments.

In FIG. 3B, attachment layer 308 is shown covering second surface 210-2, which is obscured. Attachment layer 308 may include bosses or other attachment features, as described above with respect to attachment features 306 in FIG. 3A, to provide attachment points for the enclosure part to the portable information handling system. Also, attachment layer 308 may include a portions of thermoplastic material used to form additional features, such as bosses, tabs, hinge frames, snap-in connectors, etc. used to attach the enclosure part to the portable information handling system. As shown in FIG. 3B, attachment layer 308 may be formed together with the enclosure part during heat pressing to form a final shape (not shown) of attachment layer 308.

Figure 4A:
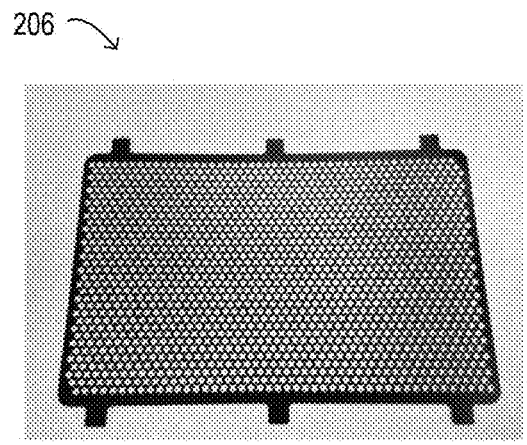
FIG. 4A is an image of an embodiment of a thermoplastic enclosure material core layer.

Referring now to FIG. 4A, an image depicting an embodiment of core layer 206 is illustrated. As shown in FIG. 4A, core layer 206 has been formed with voids in a hexagonal pattern to reduce density and weight of core layer 206. The voids may be formed using die cutting.

Figure 4B:
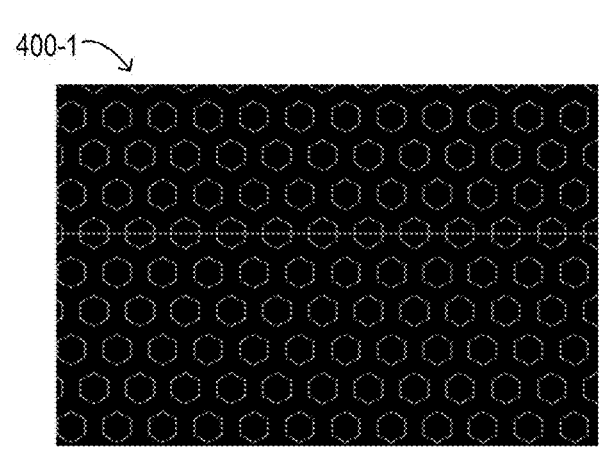
FIG. 4B is an image of an embodiment of a thermoplastic enclosure material core layer.

Referring now to FIG. 4B, an image depicting an embodiment of hexagonal pattern 400-1 is illustrated. Hexagonal pattern 400-1 is a schematic illustration and may not be drawn to scale. As shown in FIG. 4B, hexagonal pattern 400-1 has single voids for each hexagonal cell and corresponds to core layer 206 in FIG. 4A.

Figure 4C:
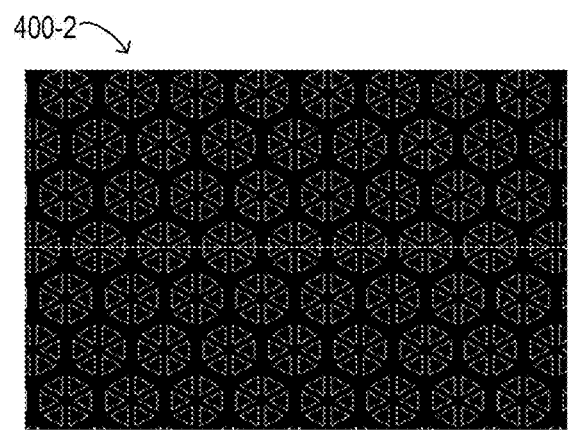
FIG. 4C is an image of an embodiment of a thermoplastic enclosure material core layer.

Referring now to FIG. 4C, an image depicting an embodiment of hexagonal pattern 400-2 is illustrated. Hexagonal pattern 400-2 is a schematic illustration and may not be drawn to scale. As shown in FIG. 4C, hexagonal pattern 400-2 has multiple voids for each hexagonal cell that form ribs, as an alternative hexagonal void pattern to core layer 206 in FIG. 4A.

Figure 4D:
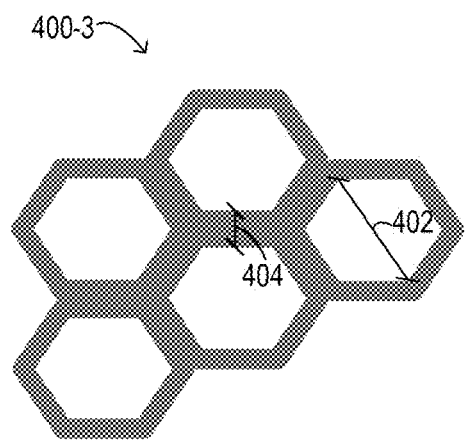
FIG. 4D is an image of an embodiment of a thermoplastic enclosure material core layer.

Referring now to FIG. 4D, a block diagram depicting an embodiment of hexagonal pattern 400-3 is illustrated. Hexagonal pattern 400-3 is a schematic illustration and may not be drawn to scale. As shown in FIG. 4D, hexagonal pattern 400-3 may be substantially similar to hexagonal pattern 400-1 in FIG. 4B, having single voids for each hexagonal cell and corresponding to core layer 206 in FIG. 4A. In hexagonal pattern 400-3, each hexagonal cell has span 402, which is a dimension of the central opening of the hexagonal cell. Also, hexagonal pattern 400-3 shows wall thickness 404 for interior hexagonal cells. In given embodiments, wall thickness 404 may be about 0.50-0.75 times span 402.

Figure 5:
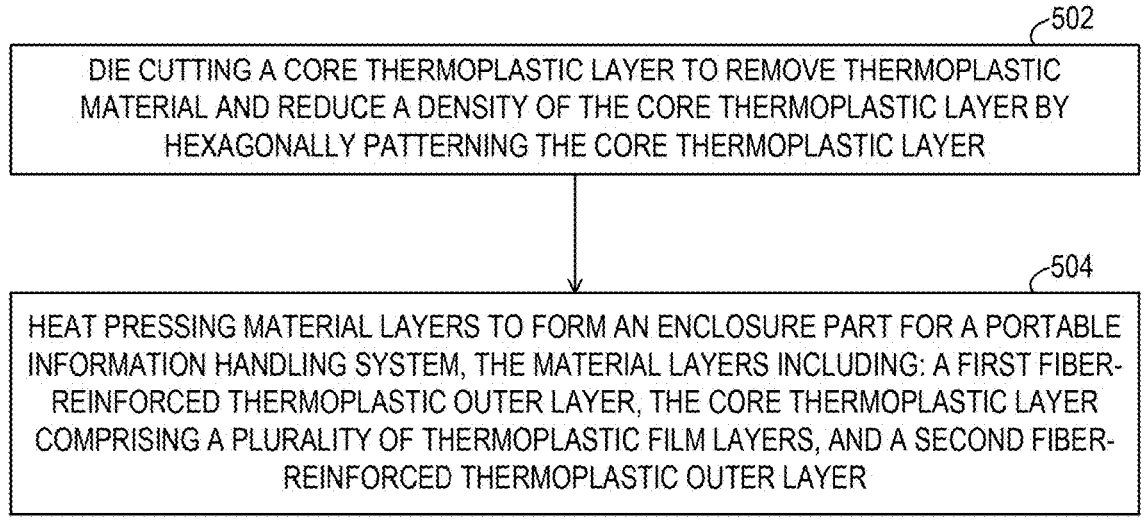
FIG. 5 is flowchart depicting selected elements of an embodiment of a method for manufacturing enclosure parts for portable information handling systems.

Referring now to FIG. 5, a block diagram of selected elements of an embodiment of method 500 for manufacturing enclosure parts for portable information handling systems (such as information handling system 100) is depicted in flowchart form. It is noted that certain operations described in method 500 may be optional or may be rearranged in different embodiments.

Method 500 may begin by die cutting (operation 502) a core thermoplastic layer to remove thermoplastic material and reduce a density of the core thermoplastic layer by hexagonally patterning the core thermoplastic layer. Then, material layers may be heat pressed (operation 504) to form an enclosure part for a portable information handling system, the material layers including: a first fiber-reinforced thermoplastic outer layer, the core thermoplastic layer comprising a plurality of thermoplastic film layers, and a second fiber-reinforced thermoplastic outer layer.

Figure 6:
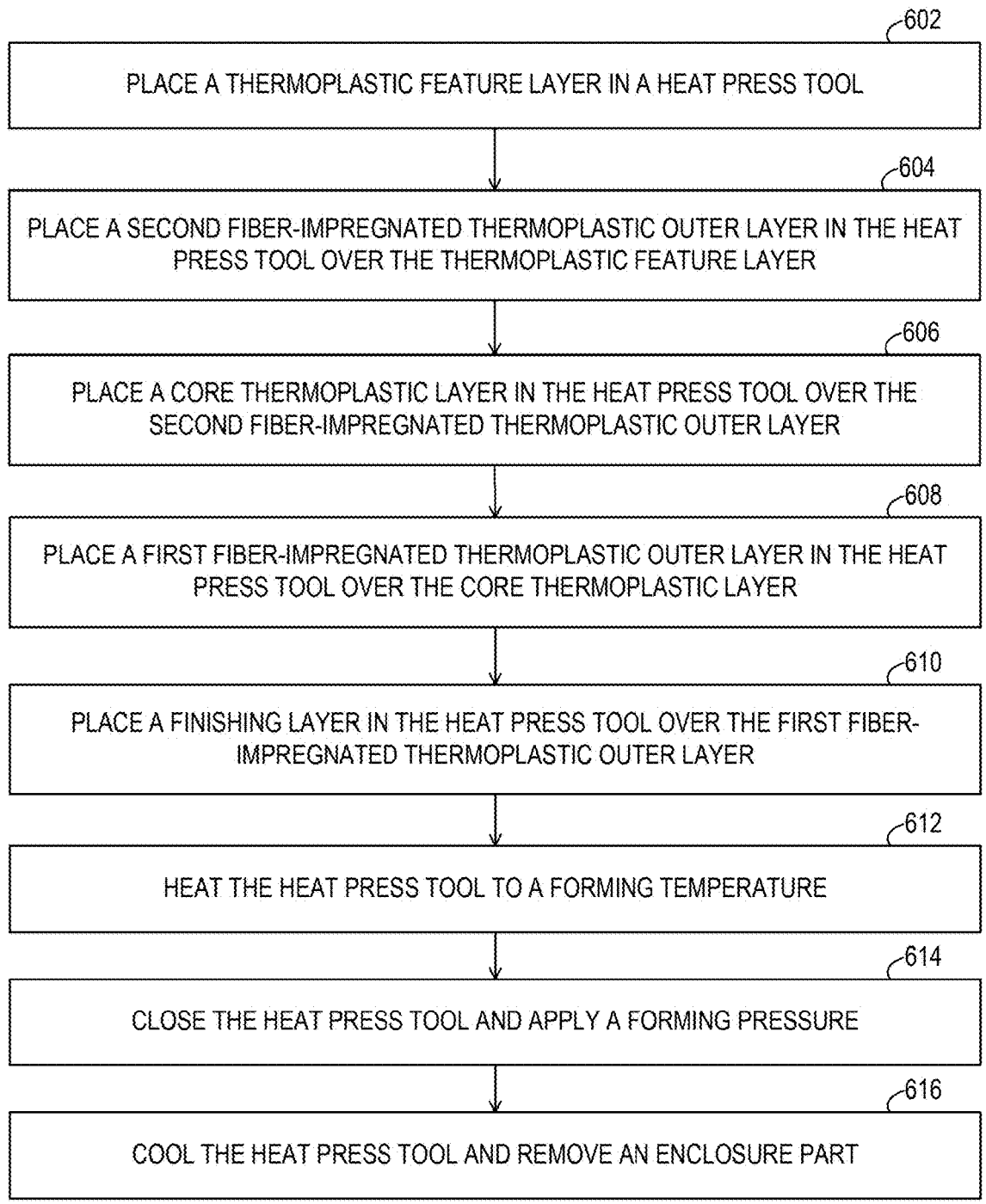
FIG. 6 is flowchart depicting selected elements of an embodiment of a method for manufacturing enclosure parts for portable information handling systems.

Referring now to FIG. 6, a block diagram of selected elements of an embodiment of method 504 for manufacturing enclosure parts for portable information handling systems (such as information handling system 100) is depicted in flowchart form. Manufacture of enclosure parts may involve different steps, in particular embodiments. Method 504 may accordingly represent one embodiment of operation 504 in method 500 (see FIG. 5). It is noted that certain operations described in method 504 may be optional or may be rearranged in different embodiments.

Method 504 may begin by placing (operation 602) a thermoplastic feature layer in a heat press tool. A second fiber-impregnated thermoplastic outer layer may be placed (operation 604) in the heat press tool over the thermoplastic feature layer. A core thermoplastic layer may be placed (operation 606) in the heat press tool over the second fiber-impregnated thermoplastic outer layer. A first fiber-impregnated thermoplastic outer layer may be placed (operation 608) in the heat press tool over the core thermoplastic layer. A finishing layer may be placed (operation 610) in the heat press tool over the first fiber-impregnated thermoplastic outer layer. It is noted that operations 602-610 may be performed in one operation, for example, when the thermoplastic feature layer, the second fiber-impregnated thermoplastic outer layer, the core thermoplastic layer, the first fiber-impregnated thermoplastic outer layer, and the thermoplastic feature layer are collated, consolidated, or otherwise stacked together prior to introduction in the heat press tool. The heat press tool may be heated (operation 612) to a forming temperature. The forming temperature may be based, at least in part, on a particular thermoplastic material used for the enclosure part. The heat press tool may be closed (operation 614) and a forming pressure may be applied. The heat press tool may include a mold cavity for defining a shape of the enclosure part. The heat press tool may be closed (operation 616) and an enclosure part may be removed.

As disclosed herein, enclosure parts for portable information handling systems may be made by heat pressing material layers together. The material layers may include outer fiber-reinforced thermoplastic layers and a core thermoplastic layer comprising a plurality of thermoplastic film layers. The core thermoplastic layer may be die cut to create voids that reduce weight of the enclosure part. A finishing layer may be added, along with attachment features.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An enclosure part for portable information handling systems, the enclosure part comprising:
   a plurality of material layers formed together in a rectangular shape, wherein the material layers comprise:
      a first fiber-reinforced thermoplastic outer layer comprising a first surface;
      a core thermoplastic layer comprising a plurality of thermoplastic film layers and a hexagonal pattern including cell walls forming hexagonal cells and multiple voids within each hexagonal cell separated by ribs each having a thickness of less than that of the cell walls; and
      a second fiber-reinforced thermoplastic outer layer comprising a second surface;
   wherein the enclosure part is rectangularly shaped, and wherein a ratio of a maximum diagonal dimension to a minimum thickness of the enclosure part is between 170 and 400;
   wherein the material layers further comprise:
      a thermoplastic attachment feature directly bonded to the second fiber-reinforced thermoplastic outer layer at the second surface, wherein the thermoplastic attachment feature enables assembly of the enclosure part to a portable information handling system, wherein the thermoplastic attachment feature includes a plurality of boss clusters, each boss cluster of the plurality of boss clusters provides a plurality of attachment points configured to attach the enclosure part to the portable information handling system, that protrude from the second surface of the second fiber-reinforced thermoplastic outer layer and a thermoplastic attachment layer covering the second surface of the second fiber-reinforced thermoplastic outer layer to enable attachment to the portable information handling system; and
   wherein the thermoplastic attachment feature shares a common thermoplastic material with the second fiber-reinforced thermoplastic outer layer.

2. The enclosure part of claim 1, wherein each of the material layers comprise at least one of: polycarbonate and polysulfonate.

3. The enclosure part of claim 1, wherein the thermoplastic film layers further comprise:
   a foam structure in the thermoplastic film layers.

4. The enclosure part of claim 1, wherein the first fiber-reinforced thermoplastic outer layer and the second fiber-reinforced thermoplastic outer layer each comprise woven-fiberglass-reinforced thermoplastic material.

5. The enclosure part of claim 1, wherein the first fiber-reinforced thermoplastic outer layer and the second fiber-reinforced thermoplastic outer layer each comprise:
   a first thermoplastic tape layer comprising unidirectional carbon fibers having a first orientation of the unidirectional carbon fibers; and
   a second thermoplastic tape layer comprising unidirectional carbon fibers having a second orientation of the unidirectional carbon fibers, wherein the second orientation is different from the first orientation.

6. The enclosure part of claim 1, wherein the material layers further comprise:
   a finishing layer covering the first fiber-reinforced thermoplastic outer layer, wherein the finishing layer is an exterior surface of the enclosure part.

* * * * *